United States Patent [19]
Mycynek et al.

[11] Patent Number: 6,069,524
[45] Date of Patent: May 30, 2000

[54] FPLL WITH THIRD MULTIPLIER IN AN ANALOG INPUT SIGNAL

[75] Inventors: Victor G. Mycynek, Des Plaines; Gary J. Sgrignoli, Mt. Prospect, both of Ill.

[73] Assignee: Zenith Electronics Corporation, Glenview, Ill.

[21] Appl. No.: 09/220,785

[22] Filed: Dec. 23, 1998

[51] Int. Cl.[7] ............................ H03L 7/087; H04L 27/227
[52] U.S. Cl. .......................... 329/308; 329/309; 331/1 A; 331/12; 331/23; 348/726
[58] Field of Search ...................................... 329/307–309, 329/325, 346, 360; 331/1 A, 10–12, 17, 23, 25; 348/726, 727

[56] References Cited

U.S. PATENT DOCUMENTS 5,745,004   4/1998   Mycynek et al. ........................ 329/308

*Primary Examiner*—David Mis

[57] ABSTRACT

A FPLL has an I, a Q and a third multiplier, with the I multiplier supplying demodulated signals to a limiter and the Q multiplier supplying signals to a loop filter. A VCO and phase shift circuit supply quadrature signals to the I and Q multipliers. The analog input signal is applied to the I multiplier and to the third multiplier. The third multiplier, which is located in an AC path in the loop to avoid the effects of offsets due to stray DC voltages and currents, is also supplied with the digital output of the limiter. The third multiplier supplies its output to the Q multiplier.

7 Claims, 5 Drawing Sheets

FPLL WITH THIRD MULTIPLIER IN AN ANALOG INPUT SIGNAL

BACKGROUND OF THE INVENTION AND PRIOR ART

This Invention relates generally to FPLL (frequency and phase looked loop) circuits and specifically to FPLLs that are especially suitable for use in integrated circuitry. FPLLs are well known in the art as evidenced by U.S. Pat. Nos. 4,072,909; 4,091,410 and 4,755,762, all of which are assigned to the assignee of this application and all of which are incorporated by reference herein. FPLLs are biphase stable and require some mechanism for assuring the proper polarity of demodulated output signal when, for example, they are used in television receiver circuits and the like. In the prior art this has taken the form of determining the polarity of lock up from the FPLL output signal (or other suitable indicator) and inverting the FPLL output signal as required, to assure a desired demodulated output signal polarity.

Difficulty is often experienced in practical FPLL circuits due to small disturbances caused by offsets from stray DC voltages and currents that tend to introduce non linearities into the system. When considering an FPLL implementation in an integrated circuit (IC) environment, any slight offset to the loop can result in unsymmetrical frequency and phase lock characteristics. In addition, these undesirable characteristics may differ between the two different phase lock up modes or conditions.

U.S. Pat. No. 5,745,004, issued to the Applicants and assigned to the present Assignee, produced significant benefits in FPLL design by the simple expedient of relocating the so-called third multiplier from a DC path to an AC path. The DC, or low frequency, path processes the low frequency difference signals that are applied to the loop filter and the voltage controlled oscillator (VCO). The AC path processes the high frequency VCO signals, which in most instances, have high speed edges and are AC coupled. Removal of the third multiplier from the DC path results in more ideal performance due to lower DC offsets and non linearities. In practical implementations, it additionally results in lower power supply voltage requirements. The third multiplier in the AC path performs the function of inverting the 90° phase of the quadrature VCO signal in response to the limiter input. This environment is much more controllable since the waveforms are more uniform in size and tend to be purely digital. Presently a prescaler is used to provide the 0° and 90° phase outputs of the VCO. In this implementation, the third multiplier may conveniently take the form of an exclusive OR gate in the path after the 90° phase shifted VCO output from the prescaler. In general the 0° and 90° phase outputs of the VCO may be produced in other ways and any type of multiplier may be used in this AC path. As those skilled in the art know, care needs to be taken to insure a delay match between the in-phase and quadrature mixer circuits to keep them orthogonal.

The present invention retains the benefits of having the third multiplier in an AC path of the FPLL, but utilizes a more complex switched multiplier as the third multiplier, requires a delay matching element and involves a cascode arrangement of multipliers. These disadvantages are offset by the fact that the I and Q multipliers and the VCO and phase shifting circuits are readily available in an integrated circuit chip, thus saving the manufacturer the cost and need to design a special circuit. While the internal functioning of Applicants' patented circuit and that of the present invention is somewhat different, the end result is identical.

OBJECTS OF THE INVENTION

A principal object of the invention is to provide a novel FPLL.

Another object of the invention is to provide an FPLL of alternate design that obviates problems of the prior art.

A further object of the invention is to provide an FPLL that is especially suitable for use with an off the shelf integrated circuit PLL.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
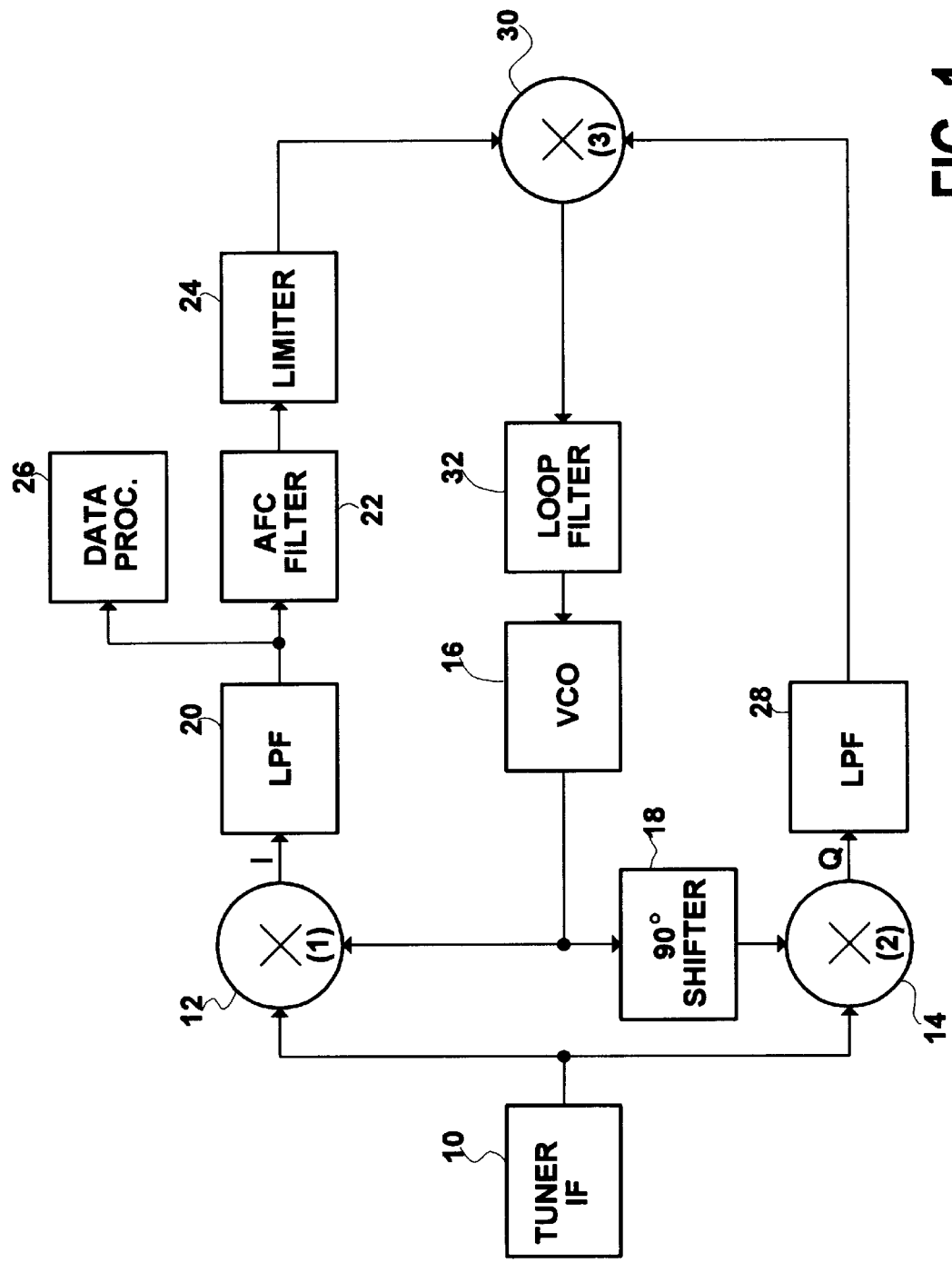
FIG. 1 is a partial block diagram of a prior art television receiver incorporating an FPLL.

FIG. 1 depicts a prior art television circuit incorporating an FPLL. A tuner-IF circuit 10 supplies an IF signal to an I multiplier 12 and to a Q multiplier 14. VCO 16 supplies a demodulating signal to first multiplier 12 and to a 90° phase shift circuit 18, which supplies a phase shifted oscillator signal to Q multiplier 14. The I and Q multipliers 12 and 14 produce sum and difference signal outputs from their input signals, and the output signals from multipliers 12 and 14 are supplied to low pass filters (LPFs) 20 and 28, respectively. The output of LPF 20 is supplied to an AFC filter 22, which in turn supplies its output signal to a limiter 24. Limiter 24 is coupled to one input of a third multiplier 30. The output of the LPF 28 supplies the Q input of multiplier 30, which multiplies its two input signals and produces an output signal that is supplied to a loop filter 32, the output of which controls VCO 16. A data processor 26 receives the demodulated input signal from LPF 26. In the usual television implementation, data processor 26 is a video processor and functions to reproduce the televised signal.

As fully explained in the above-mentioned patents and as shown in FIG. 1, frequency acquisition of the input signal is accomplished by the action of the average DC error voltage generated at the output of third multiplier 30. This average DC error voltage results from the multiplication of the beat note frequencies generated in the Q channel path (via LPF 28) and the I channel path through the phase shifting AFC filter 22 and limiter 24. At the point of frequency acquisition the beat note frequencies are sufficiently close to 0 Hz such that phase lock can occur. When phase lock is attained, the beat note output of limiter 24 becomes a fixed DC voltage (+1 or −1), thus effectively removing the frequency acquisition function, and the loop reduces to a simple PLL. Because the polarity of the output of limiter 24 determines the phase of the PLL lock up, the loop is biphase stable.

Those skilled in the art will appreciate that the third multiplier 30 is in a portion of the circuit that is affected by DC currents, due to offsets and the like. For example, in a vestigial sideband (VSB) digital transmission system, a very small pilot carrier is used for frequency and phase lock purposes. Because the pilot portion of the signal is very small, even small unwanted DC offsets, due to the presence of the third multiplier, will cause offsets and unsymmetrical frequency and phase lock characteristics and degrade the signal being demodulated in the I channel.

Figure 2:
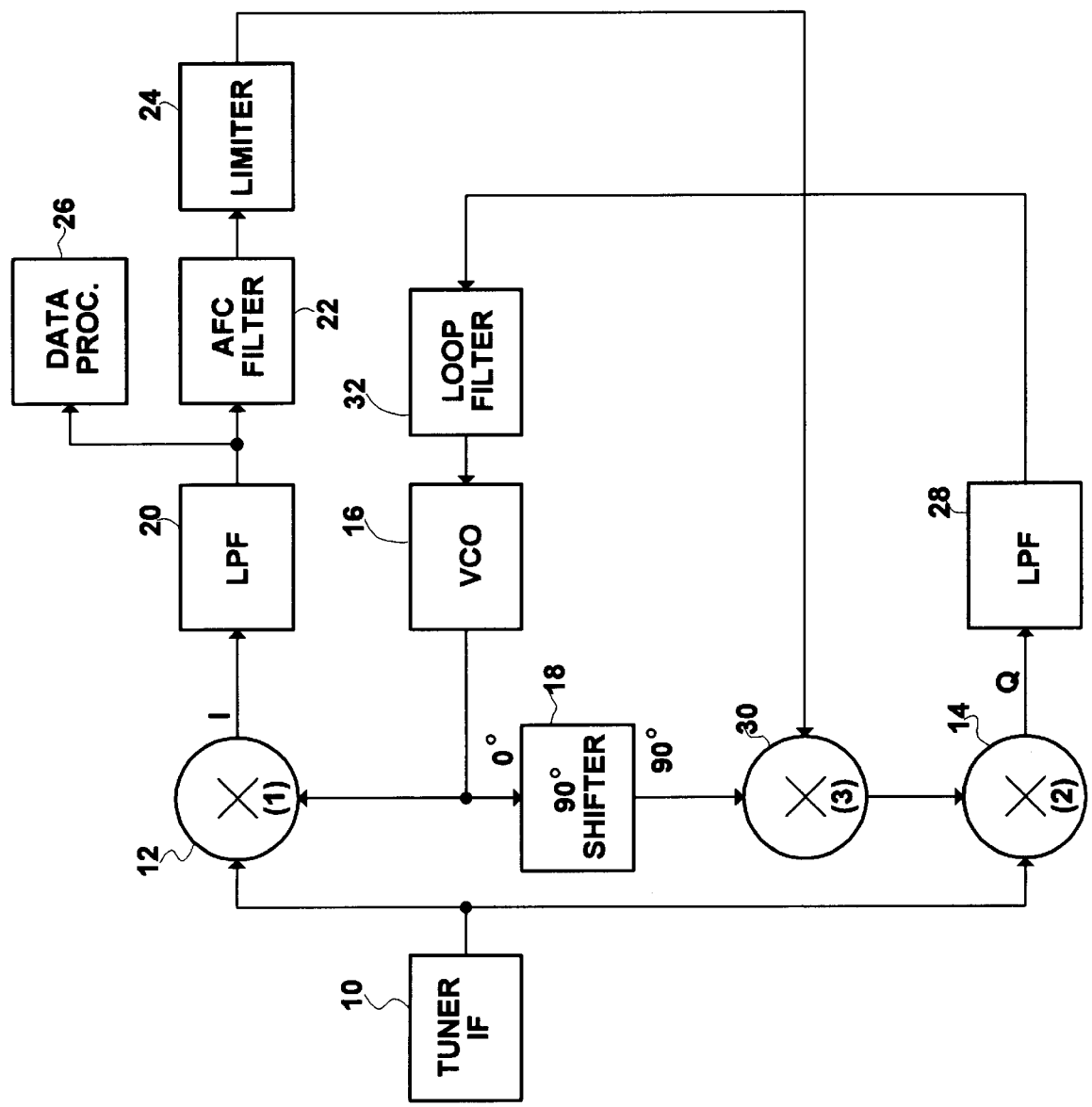
FIG. 2 is a partial block diagram of a prior art television receiver incorporating an FPLL constructed in accordance with U.S. Pat. No. 5,745,004.

In the prior art arrangement of FIG. 2, the third multiplier 30 is relocated to the AC or high frequency portion of the circuit. In this position, only well-controlled signals from 90° phase shifter 18 and limiter 24 are applied to multiplier 30. In some cases, the output of 90° phase shifter circuit 18 may also be AC coupled and/or limited to further minimize DC and timing offsets. The function of the third multiplier 30, now becomes one of generating a 0° or 180° phase shifted version of the output of 90° phase shifter 18 (that is plus and minus 90°) in response to the polarity of limiter 24. In this arrangement difficulties of the older prior art are avoided and the design lends itself especially well to an integrated circuit implementation. The output of third multiplier 30 and the output of tuner IF 10 now feed Q multiplier 14 and the output of Q multiplier 14 is coupled through LPF 28 and loop filter 32 to VCO 16. The theoretical behavior of the FPLL in FIG. 2 is quite similar to that of FIG. 1 because the multiplication process through multiplier 30 and multiplier 14 is commutative, with LPF 28 not affecting the DC and low frequency difference components associated with the operation of the FPLL.

Figure 3:
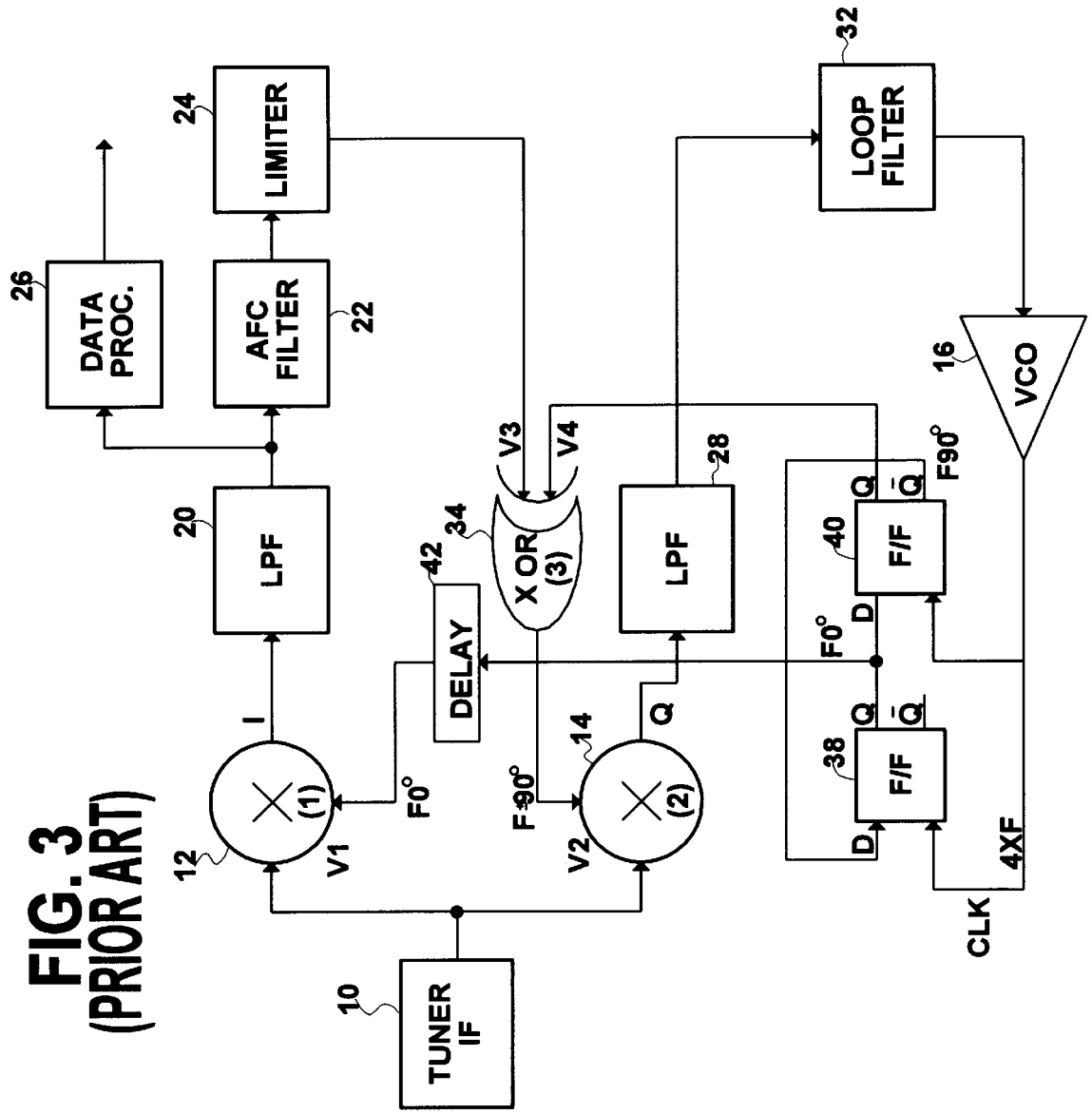
FIG. 3 is a partial systematic diagram illustrating an integrated circuit implementation of the FPLL of U.S. Pat. No. 5,745,004.

FIG. 3 is a functional block diagram of an integrated circuit of FIG. 2 form of the circuit. Assuming a digital implementation, the third multiplier 30 is replaced by an exclusive OR (XOR) gate 34. The nominal frequency of VCO 16 is 186 MHz and a prescaler, in the form of a ring counter comprising two D flip-flops 38 and 40, is used to divide the frequency by four. This technique is known in the art. A delay 42 is incorporated in the 0° path to I multiplier 12 to compensate for the delay introduced in the 90° path by the XOR 34. The 90° output of flip/flop 40 is applied to XOR 34 along with the output of limiter 24 and, depending upon the polarity of the limiter output, a plus or a minus 90° divided-down VCO signal is applied to Q multiplier 14.

Figure 4:
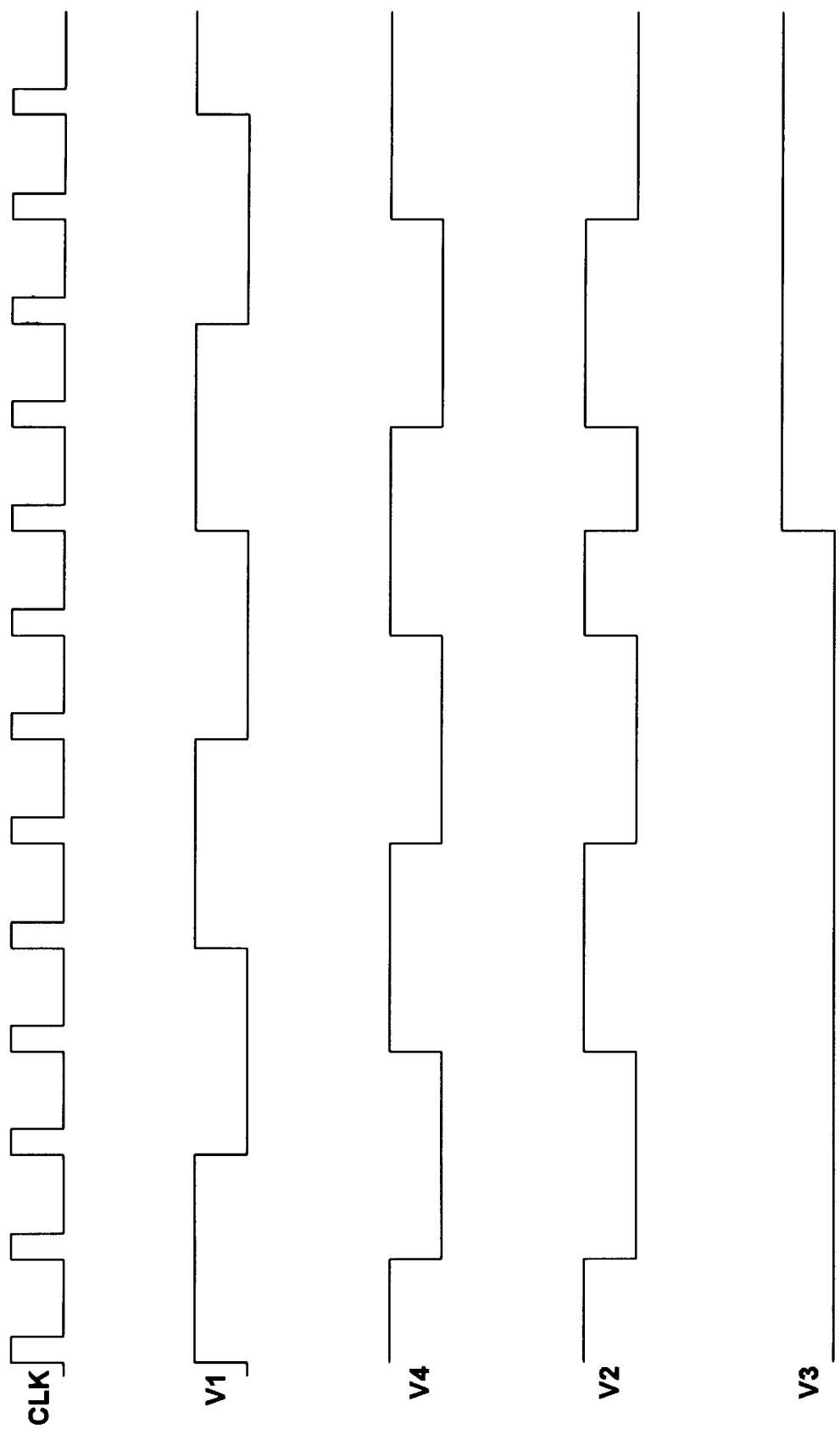
FIG. 4 is a group of waveforms related to the implementation of the FIG. 3 FPLL.

The waveforms of FIG. 4 Illustrate the development of the 90° phase displaced, divided down outputs from VCO 16. As noted on FIG. 3, clock is the VCO output, VI and V4 the 0° and 90° divided-down outputs, respectively and V3 is the output from limiter 24. The voltage V2 is the output of XOR 34 and shows the phase inversion that results from a change in polarity of V3. The voltages V1 and V4 are developed on the rising edge of the clock, which obviates problems due to an oscillator duty cycle that departs from fifty percent. The circuits of FIGS. 2 and 3 perform exactly as that of FIG. 1 in frequency acquisition and phase lock up.

Figure 5:
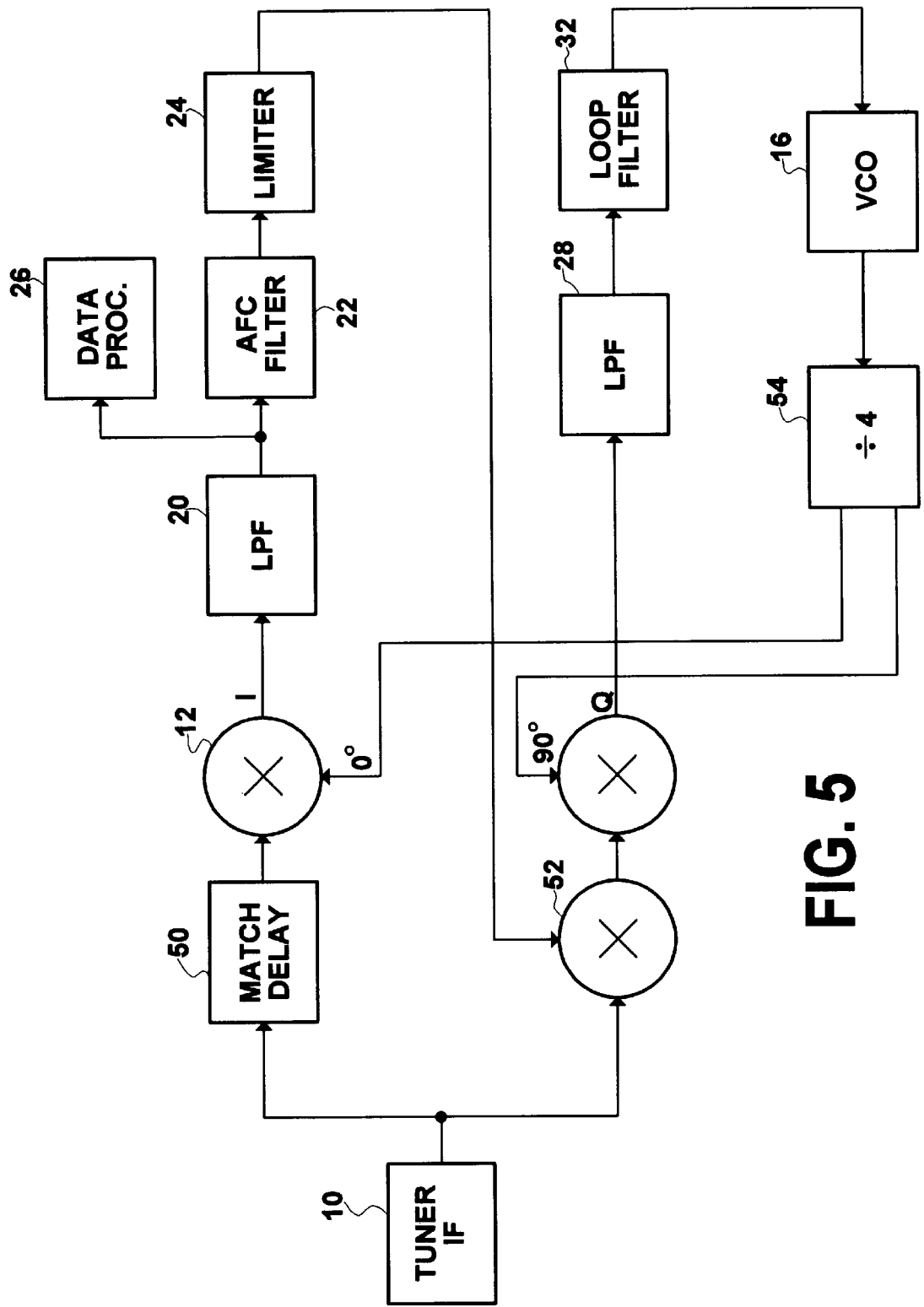
FIG. 5 is a partial block diagram of a television receiver incorporating an FPLL constructed in accordance with the present invention.

In the present invention arrangement of FIG. 5, the input analog signal is applied to I multiplier 12, through a delay matching element 50, and to third multiplier 52. The output of I multiplier 12 is supplied through LPF 20 to AFC filter 22 and limiter 24. The output of limiter 24 is however supplied to the other input of third multiplier 52, rather than to the Q multiplier 14 as in FIG. 3. The output of third multiplier 52 supplies Q multiplier 14, which in turn, is coupled to LPF 28, loop filter 32 and VCO 16, thus retaining the benefits of the FIG 3 arrangement. A divide-by-four divider 54 supplies the 90° phase displaced signals to I multiplier 12 and to Q multiplier 14. It will be noted that the DC path in this circuit is not affected by any DC offsets that may occur in the third multiplier.

Third multiplier 52 is a switching multiplier having an analog input from tuner IF 10 and a digital input from limiter 24. As mentioned above, this complicates the fabrication of an integrated circuit because of the required cascode relationship between the third multiplier and the Q multiplier that would necessitate a higher power supply voltage and increased "head room". However, all of the elements of FIG. 5, with the exception of the matching element 50 and third multiplier 52, are readily available in an off the shelf integrated circuit chip. This makes the FIG. 5 implementation very attractive to a manufacturer who doesn't wish to expend the effort and cost to produce a discrete or integrated circuit version of the invention. Yet; with respect to its output, the operation of the circuit is identical to the circuit of FIG. 3.

What has been described is a novel FPLL that solves the above-mentioned problems of the prior art in a different manner and that is especially adapted for use with an off the shelf integrated circuit chip. It is recognized that numerous changes in the described embodiment of the invention will occur to those skilled in the art without departing from its true spirit and scope. The invention is to be limited only as defined in the claims.

What is claimed is:

1. A biphase stable FPLL comprising:
   means providing an input signal;
   an I multiplier and a third multiplier connected for receiving said input signal;
   means, including a VCO, for developing two 90° phase displaced demodulation signals;
   a Q multiplier;
   means for supplying one of said 90° phase displaced signals to said I multiplier and the other of said 90° phase displaced signals to said Q multiplier,
   means for supplying the output of said third multiplier to said Q multiplier;
   limiter means coupling the output of said I multiplier to said third multiplier, and
   a loop filter coupling the output of said Q multiplier to said VCO.

2. The FPLL of claim 1, wherein said signal supplying means includes an integrated circuit chip including said I multiplier and said Q multiplier, a prescaler and a 90° phase shift circuit.

3. The FPLL of claim 2, wherein said third multiplier comprises a switching multiplier having an analog and a digital input.

4. A biphase stable FPLL comprising:
   means providing an input signal;
   an I multiplier and a third, switching type multiplier, having an analog input and a digital input connected for receiving said input signal;
   means, including a VCO, for developing two 90° phase displaced demodulation signals;
   a Q multiplier;
   means for supplying one of said 90° phase displaced signals to said I multiplier and the other of said 90° phase displaced signals to said Q multiplier,
   means for supplying the output of said third multiplier to said Q multiplier;
   limiter means coupling the output of said I multiplier to said third multiplier;
   a loop filter coupling the output of said Q multiplier to said VCO; and wherein said signal supplying means includes an integrated circuit chip including said I multiplier and said Q multiplier, a prescaler and a 90° phase shift circuit.

5. In an FPLL of the type including an I multiplier, a Q multiplier and a third multiplier, VCO means for supplying a pair of 90° phase displaced digital signals for demodulating an analog input signal, an AFC filter and limiter coupled between the I multiplier and the third multiplier, with the third multiplier being in an AC path in the FPLL, the improvement comprising:

supplying said analog input signal and the digital output signal from said limiter to said third multiplier.

6. The FPLL of claim 5, wherein said third multiplier is a switched multiplier.

7. The FPLL of claim 6, wherein said I multiplier, said Q multiplier and a prescaler and 90° phase shift circuit are included in an integrated circuit chip.

* * * * *

UNITED STATES PATENT AND TRADEMARK OFFICE
CERTIFICATE OF CORRECTION

PATENT NO : 6,069,524
DATED : May 30, 2000
INVENTOR(S): Victor G. Mycynek and Gary Sgrignoli It is certified that error appears in the above-identified patent and that said Letters Patent are hereby corrected as shown below:

In the title, the words -- AN AC PATH IN THE FPLL SUPPLIED WITH -- were omitted following the words -- FPLL WITH THIRD MULTIPLIER IN --.

The correct title should read:

"FPLL WITH THIRD MULTIPLIER IN AN AC PATH IN THE FPLL SUPPLIED WITH AN ANALOG INPUT SIGNAL.

Signed and Sealed this

Twenty-fourth Day of April, 2001

Attest:

NICHOLAS P. GODICI

Attesting Officer

Acting Director of the United States Patent and Trademark Office